US009608378B2

(12) United States Patent
Murray et al.

(10) Patent No.: US 9,608,378 B2
(45) Date of Patent: Mar. 28, 2017

(54) MULTISTAGE CAPACITIVE CROSSTALK COMPENSATION ARRANGEMENT

(71) Applicant: CommScope Technologies LLC, Hickory, NC (US)

(72) Inventors: David Patrick Murray, Bristol (GB); Bernard Harold Hammond, Jr., Cheltenham (GB)

(73) Assignee: CommScope Technologies LLC, Hickory, NC (US)

( * ) Notice: Subject to any disclaimer, the term of this patent is extended or adjusted under 35 U.S.C. 154(b) by 0 days.

(21) Appl. No.: 15/016,916

(22) Filed: Feb. 5, 2016

(65) Prior Publication Data

US 2016/0156132 A1   Jun. 2, 2016

Related U.S. Application Data

(63) Continuation of application No. 14/101,736, filed on Dec. 10, 2013, now Pat. No. 9,257,791, which is a
(Continued)

(51) Int. Cl.
*H01R 24/00* (2011.01)
*H01R 13/6466* (2011.01)
(Continued)

(52) U.S. Cl.
CPC ..... *H01R 13/6466* (2013.01); *H01R 13/6461* (2013.01); *H01R 13/6464* (2013.01);
(Continued)

(58) Field of Classification Search
CPC ........... H01R 13/6466; H01R 13/6461; H01R 13/6464; H01R 24/64; H01R 13/6658;
(Continued)

(56) References Cited

U.S. PATENT DOCUMENTS

| 4,766,402 A | 8/1988 | Crane |
|---|---|---|
| 5,295,869 A | 3/1994 | Siemon et al. |

(Continued)

FOREIGN PATENT DOCUMENTS

| CN | 2599867 | 1/2004 |
|---|---|---|
| EP | 0 901 201 A1 | 3/1999 |

(Continued)

OTHER PUBLICATIONS

Avaya, Literature depicting Systimax 1100 Panel and GS3-2 jack, sold prior to Mar. 2002.
(Continued)

*Primary Examiner* — Javaid Nasri
(74) *Attorney, Agent, or Firm* — Merchant & Gould P.C.

(57) ABSTRACT

Methods and systems for providing crosstalk compensation in a jack are disclosed. According to one method, the crosstalk compensation is adapted to compensate for undesired crosstalk generated at a capacitive coupling located at a plug inserted within the jack. The method includes positioning a first capacitive coupling a first time delay away from the capacitive coupling of the plug, the first capacitive coupling having a greater magnitude and an opposite polarity as compared to the capacitive coupling of the plug. The method also includes positioning a second capacitive coupling at a second time delay from the first capacitive coupling, the second time delay corresponding to an average time delay that optimizes near end crosstalk. The second capacitive coupling has generally the same overall magnitude but an opposite polarity as compared to the first capacitive coupling, and includes two capacitive elements spaced at different time delays from the first capacitive coupling.

21 Claims, 12 Drawing Sheets

Related U.S. Application Data continuation of application No. 13/746,386, filed on Jan. 22, 2013, now Pat. No. 8,628,360, which is a continuation of application No. 13/356,127, filed on Jan. 23, 2012, now Pat. No. 8,357,014, which is a continuation of application No. 12/953,181, filed on Nov. 23, 2010, now Pat. No. 8,100,727, which is a continuation of application No. 12/369,543, filed on Feb. 11, 2009, now Pat. No. 7,841,909.

(60) Provisional application No. 61/028,040, filed on Feb. 12, 2008.

(51) Int. Cl.

| | | |
|---|---|---|
| *H05K 1/02* | (2006.01) | |
| *H01R 13/6464* | (2011.01) | |
| *H01R 13/6461* | (2011.01) | |
| *H01R 13/66* | (2006.01) | |
| *H05K 1/16* | (2006.01) | |
| *H01R 24/64* | (2011.01) | |

(52) U.S. Cl.
CPC ....... *H05K 1/0228* (2013.01); *H01R 13/6658* (2013.01); *H01R 24/64* (2013.01); *H05K 1/162* (2013.01); *H05K 2201/09236* (2013.01); *H05K 2201/09672* (2013.01); *H05K 2201/10189* (2013.01); *Y10S 439/941* (2013.01); *Y10T 29/49204* (2015.01); *Y10T 29/49208* (2015.01); *Y10T 29/53209* (2015.01)

(58) Field of Classification Search
CPC ................ H05K 1/0228; H05K 1/162; H05K 2201/10189; H05K 2201/09236; H05K 2201/09672; Y10T 29/49208; Y10T 29/53209; Y10T 29/49204; Y10S 439/941
USPC ... 439/676, 941, 620.21, 11, 76.1, 344, 387, 439/418, 408
See application file for complete search history.

(56) References Cited

U.S. PATENT DOCUMENTS

| | | |
|---|---|---|
| 5,502,391 A | 3/1996 | Sciacero et al. |
| 5,626,497 A | 5/1997 | Bouchan et al. |
| 5,663,682 A | 9/1997 | Meline et al. |
| 5,677,633 A | 10/1997 | Moser et al. |
| 5,716,237 A | 2/1998 | Conorich et al. |
| 5,730,622 A | 3/1998 | Olson |
| 5,864,089 A | 1/1999 | Rainal |
| 5,940,959 A | 8/1999 | Caveney et al. |
| 5,963,843 A | 10/1999 | Sit et al. |
| 5,966,648 A | 10/1999 | Ortberg et al. |
| 5,967,828 A | 10/1999 | Geurts et al. |
| 5,997,358 A | 12/1999 | Adriaenssens et al. |
| 6,042,427 A | 3/2000 | Adriaenssens et al. |
| 6,107,578 A | 8/2000 | Hashim |
| 6,120,330 A | 9/2000 | Gwiazdowski |
| 6,139,371 A | 10/2000 | Troutman et al. |
| 6,165,018 A | 12/2000 | Arnett et al. |
| 6,168,474 B1 | 1/2001 | German et al. |
| 6,176,742 B1 | 1/2001 | Arnett et al. |
| 6,186,834 B1 | 2/2001 | Arnett et al. |
| 6,231,397 B1 | 5/2001 | de la Borbolla et al. |
| 6,270,381 B1 | 8/2001 | Adriaenssens et al. |
| 6,305,950 B1 | 10/2001 | Doorhy |
| 6,332,810 B1 | 12/2001 | Bareel |
| 6,346,010 B1 | 2/2002 | Emplit |
| 6,371,793 B1 | 4/2002 | Doorhy et al. |
| 6,379,157 B1 | 4/2002 | Curry et al. |
| 6,409,547 B1 | 6/2002 | Reede |
| 6,428,362 B1 | 8/2002 | Phommachanh |
| 6,441,318 B1 | 8/2002 | Kiersh et al. |
| 6,443,777 B1 | 9/2002 | McCurdy et al. |
| 6,449,768 B1 | 9/2002 | Oftedahl |
| 6,464,529 B1 | 10/2002 | Jensen et al. |
| 6,464,541 B1 | 10/2002 | Hashim et al. |
| 6,520,808 B2 | 2/2003 | Forbes et al. |
| 6,533,618 B1 | 3/2003 | Aekins |
| 6,617,947 B1 | 9/2003 | Stansbury |
| 6,635,821 B2 | 10/2003 | Loeffelholz et al. |
| 6,661,638 B2 | 12/2003 | Jackson et al. |
| RE38,519 E | 5/2004 | Doorhy et al. |
| 6,736,681 B2 | 5/2004 | Arnett |
| D492,292 S | 6/2004 | Ogren |
| D495,321 S | 8/2004 | Ogren |
| 6,769,937 B1 | 8/2004 | Roberts |
| 6,799,989 B2 | 10/2004 | Doorhy et al. |
| 6,830,488 B2 | 12/2004 | Bush et al. |
| 6,831,527 B2 | 12/2004 | Loeffelholz et al. |
| 6,840,816 B2 | 1/2005 | Aekins |
| 6,842,348 B2 | 1/2005 | Lee |
| D503,399 S | 3/2005 | Ogren |
| 6,866,548 B2 | 3/2005 | Hashim |
| 6,923,673 B2 | 8/2005 | Doorhy et al. |
| 7,043,236 B2 | 5/2006 | Lee |
| 7,052,328 B2 | 5/2006 | Ciezak et al. |
| D526,645 S | 8/2006 | Ogren |
| 7,114,985 B2 | 10/2006 | Doorhy et al. |
| 7,140,924 B2 | 11/2006 | Redfield et al. |
| 7,142,414 B2 | 11/2006 | Lee et al. |
| 7,153,168 B2 | 12/2006 | Caveney et al. |
| 7,175,476 B2 | 2/2007 | Kim et al. |
| 7,179,131 B2 | 2/2007 | Caveney et al. |
| 7,182,649 B2 | 2/2007 | Caveney et al. |
| 7,186,149 B2 | 3/2007 | Hashim |
| 7,187,249 B2 | 3/2007 | Nicholson et al. |
| 7,190,594 B2 | 3/2007 | Hashim et al. |
| 7,197,294 B2 | 3/2007 | Anderson et al. |
| RE39,546 E | 4/2007 | Phommachanh |
| 7,220,149 B2 | 5/2007 | Pharney |
| 7,230,192 B2 | 6/2007 | Loeffelholz et al. |
| D547,307 S | 7/2007 | Ogren |
| 7,265,300 B2 | 9/2007 | Adriaenssens et al. |
| 7,317,318 B2 | 1/2008 | Jackson |
| 7,381,098 B2 | 6/2008 | Hammond, Jr. et al. |
| 7,400,151 B2 | 7/2008 | Beene |
| 7,402,085 B2 | 7/2008 | Hammond, Jr. et al. |
| 7,459,640 B2 | 12/2008 | Adriaenssens et al. |
| 7,537,484 B2 | 5/2009 | Reeves et al. |
| 7,618,296 B2 | 11/2009 | Caveney |
| 7,628,656 B2 | 12/2009 | Shields et al. |
| 7,787,615 B2 | 8/2010 | Hammond, Jr. et al. |
| 7,798,857 B2 | 9/2010 | Hammond, Jr. et al. |
| 7,841,909 B2 | 11/2010 | Murray et al. |
| 8,100,727 B2 | 1/2012 | Murray et al. |
| 8,151,457 B2 | 4/2012 | Hammond, Jr. et al. |
| 8,357,014 B2 | 1/2013 | Murray |
| 8,403,709 B2 | 3/2013 | Hammond, Jr. et al. |
| 8,550,850 B2 | 10/2013 | Caveney et al. |
| 8,628,360 B2 | 1/2014 | Murray et al. |
| 9,065,223 B2 | 6/2015 | Hammond, Jr. et al. |
| 9,257,791 B2 * | 2/2016 | Murray ............... H05K 1/0228 439/676 |
| 2003/0119372 A1 | 6/2003 | Aekins |
| 2003/0168235 A1 | 9/2003 | Loeffelholz et al. |
| 2004/0067693 A1 | 4/2004 | Arnett |
| 2004/0082227 A1 | 4/2004 | Hashim |
| 2004/0184247 A1 | 9/2004 | Adriaenssens et al. |
| 2005/0106946 A1 | 5/2005 | Doorhy et al. |
| 2005/0181676 A1 | 8/2005 | Caveney et al. |
| 2005/0195583 A1 | 9/2005 | AbuGhazaleh et al. |
| 2005/0221678 A1 | 10/2005 | Hammond, Jr. |
| 2005/0253662 A1 | 11/2005 | Seefried |
| 2005/0254223 A1 | 11/2005 | Hashim et al. |
| 2006/0014410 A1 | 1/2006 | Caveney |
| 2007/0195492 A1 | 8/2007 | Tamminen et al. |
| 2007/0238365 A1 | 10/2007 | Hammond, Jr. et al. |
| 2007/0238366 A1 | 10/2007 | Hammond, Jr. et al. |
| 2007/0238367 A1 | 10/2007 | Hammond, Jr. et al. |
| 2010/0167589 A1 | 7/2010 | Hammond, Jr. et al. |
| 2011/0318965 A1 | 12/2011 | Hammond, Jr. et al. |

(56) References Cited

U.S. PATENT DOCUMENTS

2011/0318970 A1   12/2011   Hammond, Jr. et al.
2012/0003874 A1    1/2012   Reeves et al.
2012/0021636 A1    1/2012   Debenedictis et al.

FOREIGN PATENT DOCUMENTS

JP          2003-86305      3/2003
WO     WO 03/030308 A1    4/2003
WO   WO 2005/101588 A1  10/2005

OTHER PUBLICATIONS

Avaya, Literature depicting Systimax MGS200 series jack, sold prior to Aug. 1999.
Avaya, Literature depicting Systimax MGS400 series jack, sold prior to Mar. 2002.
Chan, K. et al., "Crosstalk Study in Splitter PCB Design of CAT-5 Cabling Applications," 2005 International Symposium on Electromagnetic Compatibility, vol. 3, pp. 861-865 (Aug. 2005).
European Search Report for Application No. 10163786.6 mailed Jul. 19, 2010.
International Search Report and Written Opinion for Application No. PCT/US2007/008843 mailed Oct. 26, 2007.
International Search Report and Written Opinion cited in International Application No. PCT/US2009/033892 mailed Jul. 6, 2009.
Kim, N. et al., "Reduction of Crosstalk Noise in Modular Jack for High-Speed Differential Signal Interconnection," *IEEE Transactions on Advanced Packaging*, vol. 24, No. 3, pp. 260-267 (Aug. 2001).
Neutrik AG etherCON NE8FAH Rj-45 Connector Detail Specification, 7 pages (Aug. 2003).
PulseJack 2×1 RJ45, 4 pages (Jun. 2006).

\* cited by examiner

MULTISTAGE CAPACITIVE CROSSTALK COMPENSATION ARRANGEMENT

CROSS REFERENCE TO RELATED APPLICATIONS

This application is a continuation of application Ser. No. 14/101,736, filed Dec. 10, 2013, now U.S. Pat. No. 9,257,791, which is a continuation of application Ser. No. 13/746,386, filed Jan. 22, 2013, now U.S. Pat. No. 8,628,360, which is a continuation of application Ser. No. 13/356,127, filed Jan. 23, 2012, now U.S. Pat. No. 8,357,014, which is a continuation of application Ser. No. 12/953,181, filed Nov. 23, 2010, now U.S. Pat. No. 8,100,727, which is a continuation of application Ser. No. 12/369,543, filed Feb. 11, 2009, now U.S. Pat. No. 7,841,909, which application claims the benefit of provisional application Ser. No. 61/028,040, filed Feb. 12, 2008, which applications are incorporated herein by reference in their entirety.

TECHNICAL FIELD

The present invention relates generally to telecommunications equipment. More particularly, the present invention relates to telecommunications jacks that are configured to compensate for near end crosstalk and far end crosstalk.

BACKGROUND

In the field of data communications, communications networks typically utilize techniques designed to maintain or improve the integrity of signals being transmitted via the network ("transmission signals"). To protect signal integrity, the communications networks should, at a minimum, satisfy compliance standards that are established by standards committees, such as the Institute of Electrical and Electronics Engineers (IEEE). The compliance standards help network designers provide communications networks that achieve at least minimum levels of signal integrity as well as some standard of compatibility.

One prevalent type of communication system uses twisted pairs of wires to transmit signals. In twisted pair systems, information such as video, audio and data are transmitted in the form of balanced signals over a pair of wires. The transmitted signal is defined by the voltage difference between the wires.

Crosstalk can negatively affect signal integrity in twisted pair systems. Crosstalk is unbalanced noise caused by capacitive and/or inductive coupling between wires and a twisted pair system. Crosstalk can exist in many variants, including near end crosstalk, far end crosstalk, and alien crosstalk. Near end crosstalk refers to crosstalk detected at the same end of a wire pair as the inductance causing it, while far end crosstalk refers to crosstalk resulting from inductance at a far end of a wire pair. Alien crosstalk refers to crosstalk that occurs between different cables (i.e. different channels) in a bundle, rather than between individual wires or circuits within a single cable. Alien crosstalk can be introduced, for example, at a multiple connector interface. With increasing data transmission speeds, increasing alien crosstalk is generated among cables, and must be accounted for in designing systems in which compensation for the crosstalk is applied. The effects of all crosstalk become more difficult to address with increased signal frequency ranges.

The effects of crosstalk also increase when transmission signals are positioned closer to one another. Consequently, communications networks include areas that are especially susceptible to crosstalk because of the proximity of the transmission signals. In particular, communications networks include connectors that bring transmission signals in close proximity to one another. For example, the contacts of traditional connectors (e.g., jacks and plugs) used to provide interconnections in twisted pair telecommunications systems are particularly susceptible to crosstalk interference. Furthermore, alien crosstalk has been observed that could not be explained by the current models which sum connectors and cable component results to calculate channel results. This "excess" alien crosstalk is not compensated for in existing designs.

FIG. 1 shows a prior art panel 20 adapted for use with a twisted pair telecommunications system. The panel 20 includes a plurality of jacks 22 placed in close proximity with one another. Each jack 22 includes a port 24 adapted to receive a standard telecommunications plug 26. Each of the jacks 22 is adapted to be terminated to four twisted pairs of transmission wires. As shown at FIG. 2, each of the jacks 22 includes eight contact springs labeled as having positions 1-8. In use, contact springs 4 and 5 are connected to a first pair of wires, the contact springs 1 and 2 are connected to a second pair of wires, contact springs 3 and 6 are connected to a third pair of wires, and contact springs 7 and 8 are connected to a fourth pair of wires. As shown at FIG. 3, a typical plug 26 also has eight contacts (labeled 1-8) adapted to interconnect with the corresponding eight contacts of the jack 22 when the plug is inserted within the port 24.

To promote circuit density, the contacts of the jacks and the plugs are required to be positioned in fairly close proximity to one another. Thus, the contact regions of the jacks and plugs are particularly susceptible to crosstalk. Furthermore, certain pairs of contacts are more susceptible to crosstalk than others. For example, the first and third pairs of contacts in the plugs and jacks are typically most susceptible to crosstalk.

To address the problems of crosstalk, jacks have been designed with contact spring configurations adapted to reduce the capacitive coupling generated between the contact springs so that crosstalk is minimized. An alternative approach involves intentionally generating crosstalk having a magnitude and phase designed to compensate for or correct crosstalk caused at the plug or jack. Typically, crosstalk compensation can be provided by manipulating the positioning of the contacts or leads of the jack or can be provided on a circuit board used to electrically connect the contact springs of the jack to insulation displacement connectors of the jack.

The telecommunications industry is constantly striving toward larger signal frequency ranges. As transmission frequency ranges widen, crosstalk becomes more problematic. Thus, there is a need for further development relating to crosstalk remediation.

SUMMARY

In accordance with the present disclosure, the above and other problems are solved by the following.

In a first aspect, a method for providing crosstalk compensation in a jack is disclosed. According to the method, the crosstalk compensation is adapted to compensate for undesired crosstalk generated at a capacitive coupling located at a plug inserted within the jack. The method includes positioning a first capacitive coupling a first time delay away from the capacitive coupling of the plug, the first capacitive coupling having a greater magnitude and an opposite polarity as compared to the capacitive coupling of the plug. The method also includes positioning a second capacitive coupling at a second time delay from the first capacitive coupling, the second time delay corresponding to an average time delay that optimizes near end crosstalk. The second capacitive coupling has generally the same overall magnitude but an opposite polarity as compared to the first capacitive coupling, and includes two capacitive elements spaced at different time delays from the first capacitive coupling.

In a second aspect, a telecommunications jack is disclosed for use in a twisted pair system. The jack includes a housing defining a port for receiving a plug. The jack also includes a plurality of contact springs adapted to make electrical contact with the plug when the plug is inserted into the port of the housing. The jack includes a plurality of wire termination contacts for terminating wires to the jack, and a circuit board including conductive tracks that electrically connect the contact springs to the wire termination contacts. The jack further includes a crosstalk compensation arrangement that provides crosstalk compensation between selected tracks of the circuit board. The crosstalk compensation arrangement includes a first zone of compensation a first time delay away from the capacitive coupling of the plug and a second zone of compensation at an second time delay from the first zone of compensation, the second zone of compensation including two capacitive elements spaced at different time delays from the first zone of compensation to optimize far end crosstalk and having an average time delay that optimizes near end crosstalk.

In a third aspect, a crosstalk compensation system within a telecommunications jack is disclosed. The crosstalk compensation system includes a circuit board and a plurality of contact springs mounted on the circuit board, the contact springs including first, second, third, fourth, fifth, sixth, seventh and eighth consecutively arranged contact springs. The crosstalk compensation system further includes a plurality of wire termination contacts mounted on the circuit board, the wire termination contents including first, second, third, fourth, fifth, sixth, seventh and eighth wire termination contacts for terminating wires to the jack, and a plurality of tracks on the circuit board, the tracks including first, second, third, fourth, fifth, sixth, seventh and eighth tracks that respectively electrically connect the first, second, third, fourth, fifth, sixth, seventh and eighth contact springs to the first, second, third, fourth, fifth, sixth, seventh and eighth wire termination contacts. The crosstalk compensation system includes a crosstalk compensation arrangement that provides crosstalk compensation between the tracks of the circuit board. The crosstalk compensation arrangement includes a first zone of compensation a first time delay away from the contact springs and a second zone of compensation at an second time delay from the first zone of compensation, the second zone of compensation including two capacitive elements spaced at different time delays from the first capacitive coupling and having an average time delay that that optimizes near end crosstalk.

In a fourth aspect, a method for determining the positions of first and second zones of crosstalk compensation in a jack is disclosed. The method is directed to a jack in which the first and second zones of crosstalk compensation are adapted to compensate for undesired crosstalk caused by an undesired capacitive coupling located at a plug inserted within the jack, the first zone of crosstalk compensation including a first capacitive coupling positioned a first time delay away from the undesired capacitive coupling of the plug, the first capacitive coupling having a greater magnitude and an opposite polarity as compared to the undesired capacitive coupling of the plug, the second zone of crosstalk compensation including a second capacitive coupling having two capacitive elements positioned, on average, a second time delay away from the first capacitive coupling, the second capacitive coupling having generally the same magnitude but an opposite polarity as compared to the first capacitive coupling. The method includes positioning the first and second capacitive couplings in initial positions in which the first and second time delays are generally equal to one another. The method also includes adjusting the position of the second capacitive coupling from the initial position to an adjusted position to provide improved near end crosstalk compensation. The method further includes adjusting the position of the first and second capacitive elements to different lengths to provide improved far end crosstalk compensation while maintaining the adjusted position of the second capacitive coupling as the average position of the first and second capacitive elements.

In a fifth aspect, a method of designing a crosstalk compensation system for a telecommunications jack is disclosed. The method includes positioning a first zone of crosstalk compensation across at least a first wire pair and a second wire pair on a circuit board within a telecommunications jack, the first zone of crosstalk compensation placed at a first distance from contact springs associated with the first wire pair and the second wire pair. The method also includes positioning a second zone of crosstalk compensation across the at least first and second wire pairs at a second distance from the first zone of crosstalk compensation, the second zone of crosstalk compensation including a first capacitive coupling and a second capacitive coupling. The method further includes altering the position of the capacitive couplings to establish a distance between the first capacitive coupling and the second capacitive coupling while maintaining the second distance as an average distance from the first zone of crosstalk compensation. Using the method disclosed, altering the position of the capacitive couplings provides improved far end crosstalk compensation.

DETAILED DESCRIPTION

Figure 1:
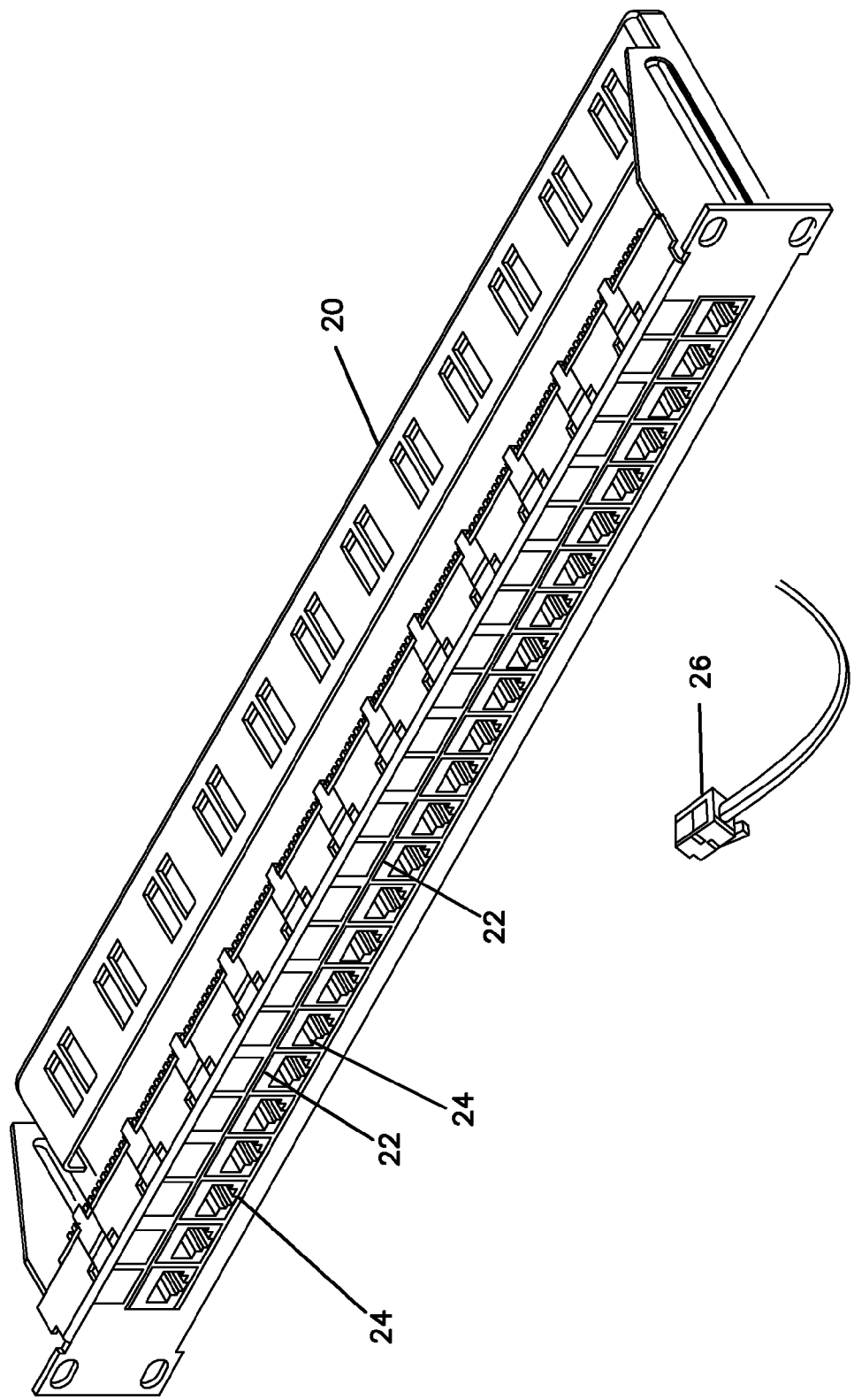
FIG. 1 is a perspective view of a prior art telecommunications panel.
Figure 2:
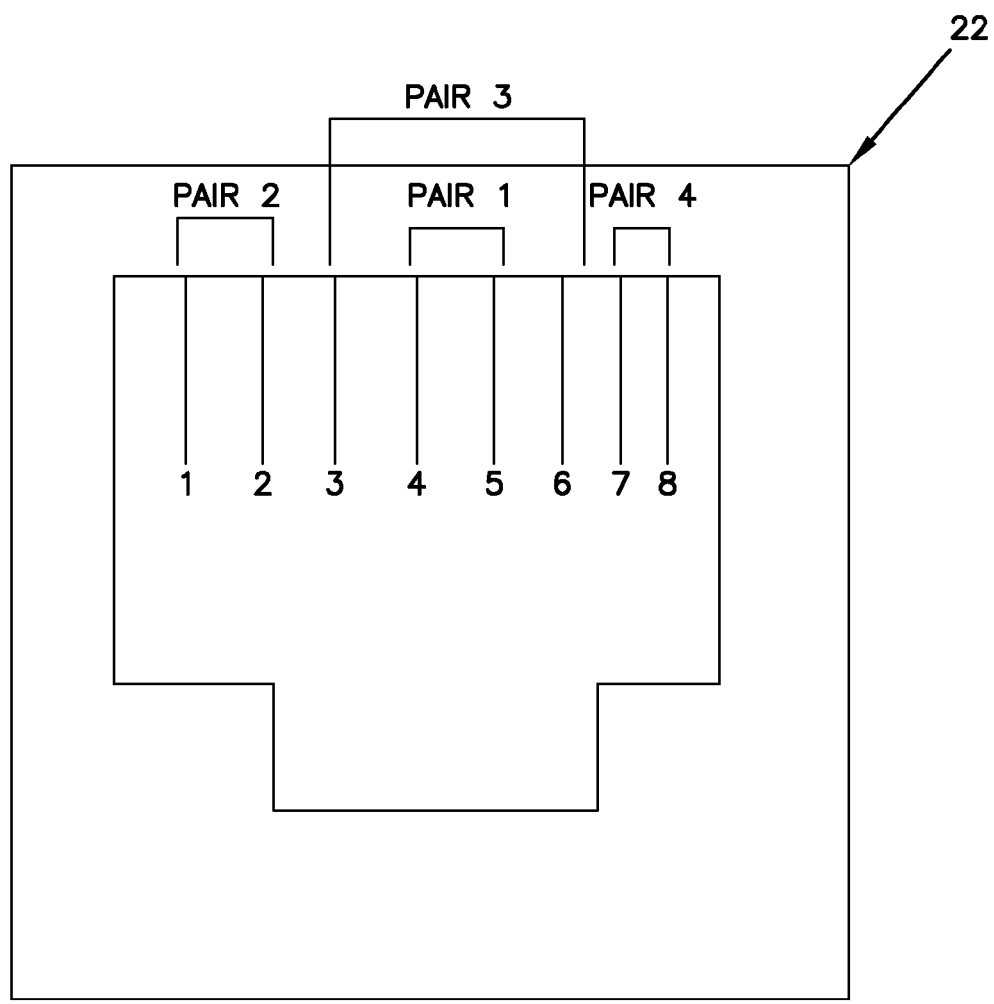
FIG. 2 is a schematic illustration of a prior art jack.
Figure 3:
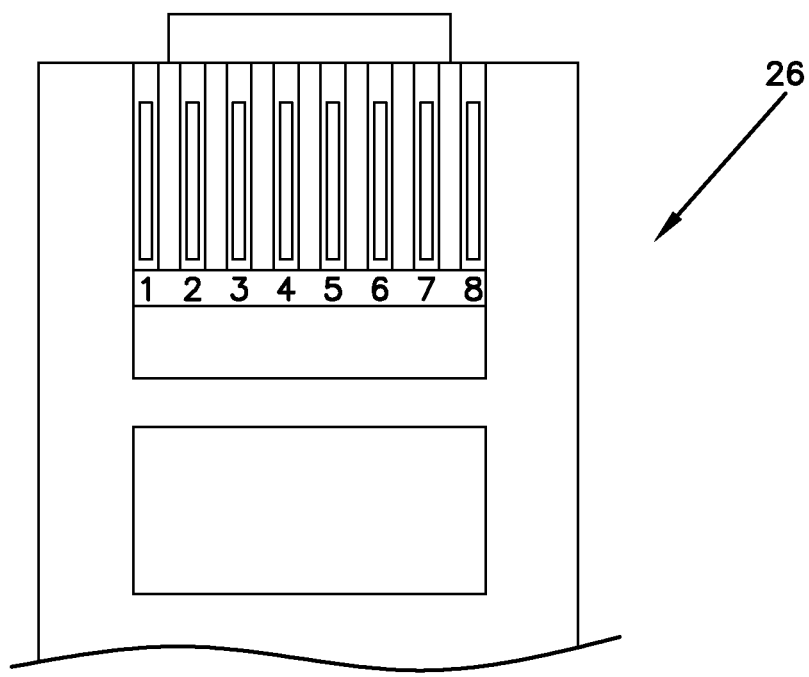
FIG. 3 is a schematic representation of a prior art telecommunications plug.

Various embodiments of the present disclosure will be described in detail with reference to the drawings, wherein like reference numerals represent like parts and assemblies throughout the several views. Additionally, any examples set forth in this specification are not intended to be limiting and merely set forth some of the many possible embodiments for how aspects of the disclosure may be practiced.

In general, the present disclosure relates to methods and systems for improving far end crosstalk compensation without adversely affecting near end crosstalk compensation within a telecommunications jack. The present disclosure generally describes crosstalk compensation schemes in which near end and far end crosstalk are accounted for and compensated against. In certain aspects, the crosstalk compensation is achieved by use of at least two stages of capacitive compensation, in which the second stage is placed at an average time delay from the first stage such that near end crosstalk is optimized. The second stage has at least two capacitive elements spaced at different time delays from the first capacitive coupling to optimize far end crosstalk.

The present disclosure also relates to methods and systems for compensating for alien crosstalk in a telecommunications jack. The present disclosure describes crosstalk compensation schemes in which alien crosstalk is compensated against, such as by selecting imbalanced capacitive arrangements across wire pairs to reduce the overall crosstalk experienced in a system, despite the potential for imbalanced compensation between wire pairs within a single jack.

Figure 4:
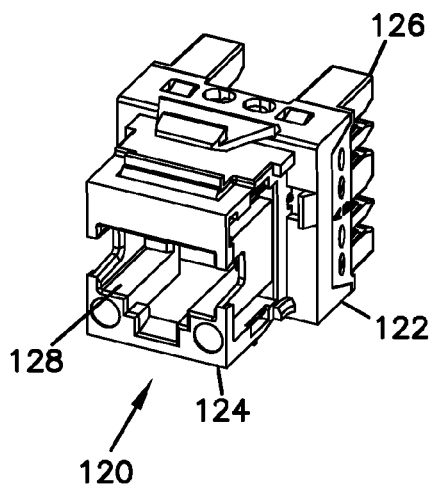
FIG. 4 is a front, perspective view of a telecommunications jack having features that are examples of inventive aspects in accordance with the principles of the present disclosure.
Figure 5:
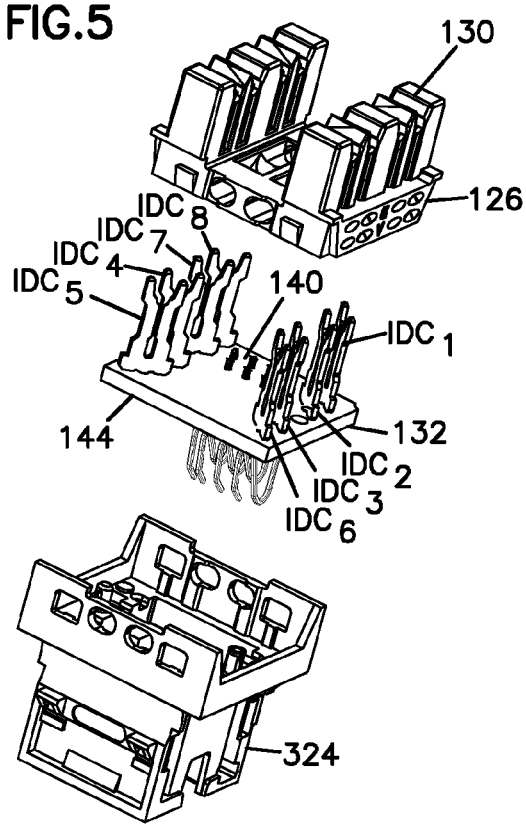
FIG. 5 is an exploded view of the jack of FIG. 4.

FIGS. 4 and 5 show a telecommunications jack 120 (i.e., a telecommunications connector) having features that are examples of inventive aspects in accordance with the principles of the present disclosure. The jack 120 includes a dielectric housing 122 having a front piece 124 and a rear piece 126. The front and rear pieces 124, 126 can be interconnected by a snap fit connection. The front piece 124 defines a front port 128 sized and shaped to receive a conventional telecommunications plug (e.g., an RJ style plug such as an RJ 45 plug). The rear piece 126 defines an insulation displacement connector interface and includes a plurality of towers 130 adapted to house insulation displacement connector blades/contacts. The jack 120 further includes a circuit board 132 that mounts between the front and rear pieces 124, 126 of the housing 122. A plurality of contact springs $CS_1$-$CS_8$ are terminated to a front side of the circuit board 132. A plurality of insulation displacement connector blades $IDC_1$-$IDC_8$ are terminated to a back side of the circuit board 132. The contact springs $CS_1$-$CS_8$ extend into the front port 128 and are adapted to be electrically connected to corresponding contacts provided on a plug when the plug is inserted into the front port 128. The insulation displacement connector blades $IDC_1$-$IDC_8$ fit within the towers 130 of the rear piece 126 of the housing 122. The circuit board 132 has tracks $T_1$-$T_8$ (e.g., tracings, see FIGS. 14-17) that respectively electrically connect the contact springs $CS_1$-$CS_8$ to the insulation displacement connector blades $IDC_1$-$IDC_8$.

In use, wires are electrically connected to the contact springs $CS_1$-$CS_8$ by inserting the wires between pairs of the insulation displacement connector blades $IDC_1$-$IDC_8$. When the wires are inserted between pairs of the insulation displacement connector blades $IDC_1$-$IDC_8$, the blades cut through the insulation of the wires and make electrical contact with the center conductors of the wires. In this way, the insulation displacement connector blades $IDC_1$-$IDC_8$, which are electrically connected to the contact springs $CS_1$-$CS_8$ by the tracks on the circuit board, provide an efficient means for electrically connecting a twisted pair of wires to the contact springs $CS_1$-$CS_8$ of the jack 120.

Figure 6:
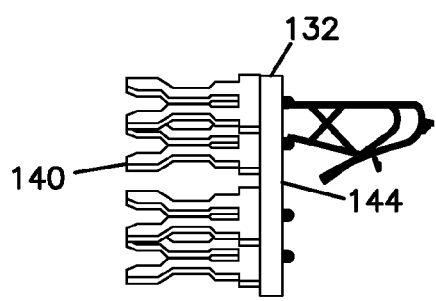
FIG. 6 is a side view of the circuit board, insulation displacement connectors and contact springs of the telecommunications jack of FIG. 4.
Figure 7:
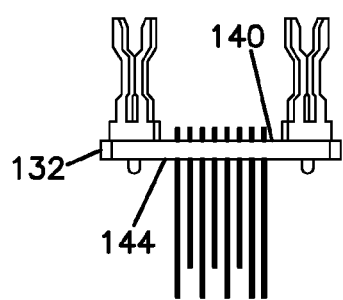
FIG. 7 is a front view of the circuit board, contact springs and insulation displacement connectors of FIG. 6.
Figure 8:
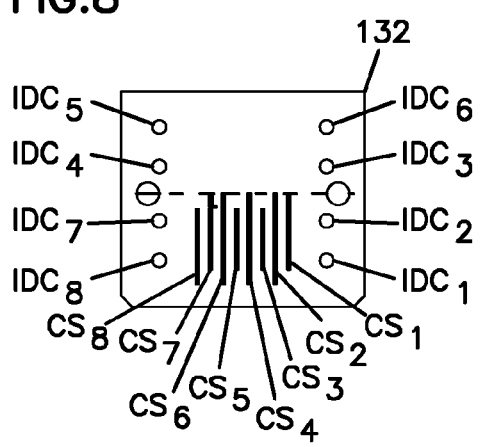
FIG. 8 is a top view of the circuit board and contact springs of FIG. 6.

The contact springs $CS_1$-$CS_8$ are shown more clearly in FIGS. 6-8. The relative positioning, shape and curvature of the contact springs $CS_1$-$CS_8$ is preferably adapted to provide some initial crosstalk compensation at the jack 120.

Figure 9:
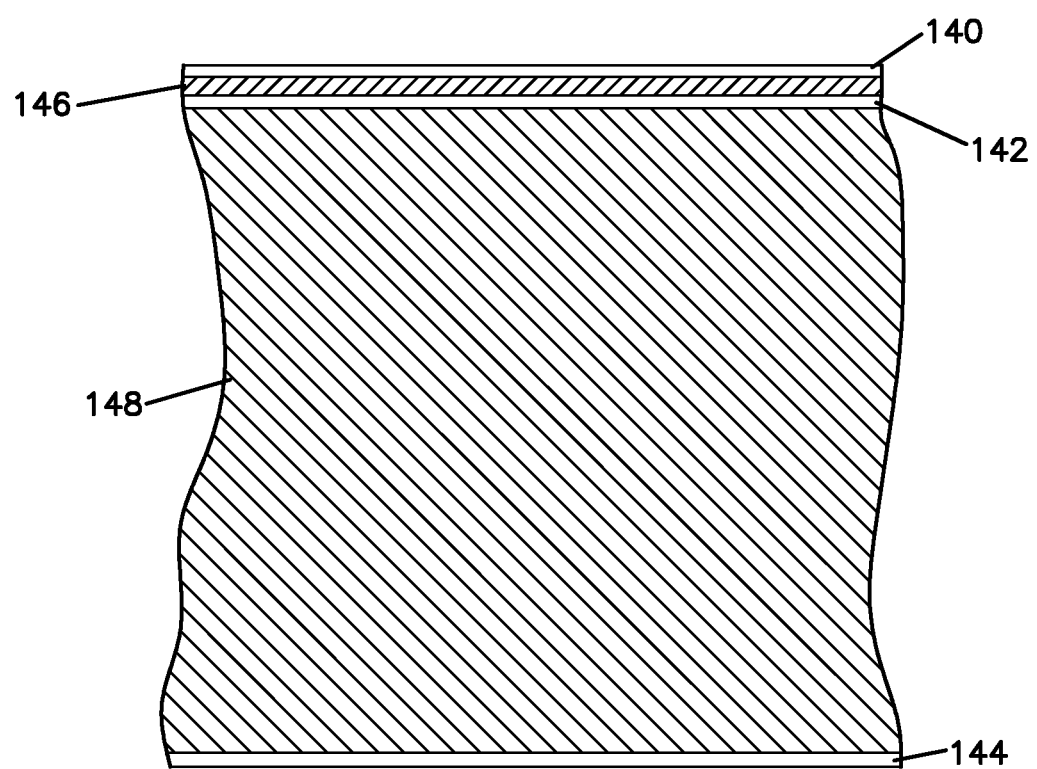
FIG. 9 is a cross-sectional view taken along section line 9-9 of FIG. 8.

The circuit board 132 of the jack 120 is preferably a multiple layer circuit board. For example, FIG. 9 shows the circuit board 132 including a first conductive layer 140, a second conductive layer 142 and a third conductive layer 144. The first and second conductive layers 140, 142 are separated by a first dielectric layer 146. The second and third conductive layers 142, 144 are separated by a second dielectric layer 148. The first conductive layer 140 is located at a front side of the circuit board 132 and the third conductive layer 144 is located at a back side of the circuit board 132. The contact springs $CS_1$-$CS_8$ are mounted at the front side of the circuit board 132, while the insulation displacement connector blades $IDC_1$-$IDC_8$ are mounted at the back side of the circuit board 132. Vias extend through the first and second dielectric layers 146, 148 to provide electrical connections between the conductive layers 140, 142 and 144. The conductive layers 140, 142 and 144 are defined by electrically the conductive tracks $T_1$-$T_8$ (see FIGS. 14-17). The tracks $T_1$-$T_8$ are formed (e.g., etched or otherwise provided) on the dielectric layers 146, 148.

The circuit board 132 preferably includes structures for compensating for near end crosstalk that occurs at the jack/plug interface. In certain embodiments, the structures for compensating for near end crosstalk include capacitive couplings provided between the first and second conductive layers 140, 142. In preferred embodiments, the capacitive couplings are provided by sets of opposing, generally parallel capacitive plates located at the first and second conductive layers 140, 142. To increase the magnitude of the capacitive coupling provided between the capacitive plates of the first and second conductive layers 140, 142, it is desirable for the first dielectric layer 146 to be relatively thin. For example, in certain embodiments the first dielectric layer 146 can have a thickness $t_1$ less than about 0.01 inches, or less than about 0.0075 inches, or less than about 0.005 inches, or less than 0.003 inches. In other embodiments, the thickness $t_1$ can be in the range of 0.001 inches to 0.003 inches or in the range of 0.001 inches to 0.005 inches. In a preferred embodiment, the thickness $t_1$ is about 0.002 inches.

In certain embodiments, the first dielectric layer 146 can be made of a material having a relatively low dielectric constant. As used herein, dielectric constants are dielectric constants relative to air. In certain embodiments, the dielectric constant of the first dielectric layer 146 can be equal to or less than about 5. In other embodiments, the dielectric constant of the first dielectric layer 146 can be less than or equal to about 4 or less than or equal to about 3. An example material for manufacturing the first dielectric layer 146 is a flame resistant 4 (FR-4) circuit board material. FR-4 circuit board material is a composite of a resin epoxy reinforced with a woven fiberglass mat.

The second dielectric layer 148 is preferably configured to isolate the third conductive layer 144 from the first and second conductive layers 140, 142. The second dielectric layer 148 can have a different thickness $t_2$ than the thickness $t_1$ of the first dielectric layer 146. In certain embodiments, the second dielectric layer 148 is at least 2.5 times thicker than the first dielectric layer 146 or at least five times thicker than the first dielectric layer 146. In still other embodiments, the second dielectric layer 148 is at least 10 times or at least 20 times thicker than the first dielectric layer 146. In one example embodiment, the thickness $t_2$ of the second dielectric layer 148 is in the range of 0.050 inches to 0.055 inches. In another example embodiment, the thickness $t_2$ of the second dielectric layer 148 is in the range of 0.040 inches to 0.050 inches.

The second dielectric layer 148 can also be manufactured of a different material as compared to the first dielectric layer 146. In certain embodiments, the second dielectric layer can have different dielectric properties as compared to the first dielectric layer 146. For example, in certain embodiments the first dielectric layer 146 can have a dielectric constant that is greater (e.g., at least 1.5 times or at least 2 times greater) than the dielectric constant of the second dielectric layer 148. In one example, the second dielectric layer 148 can be manufactured of a material such as FR-4. Of course, it will be appreciated that other materials could also be used.

Figure 10:
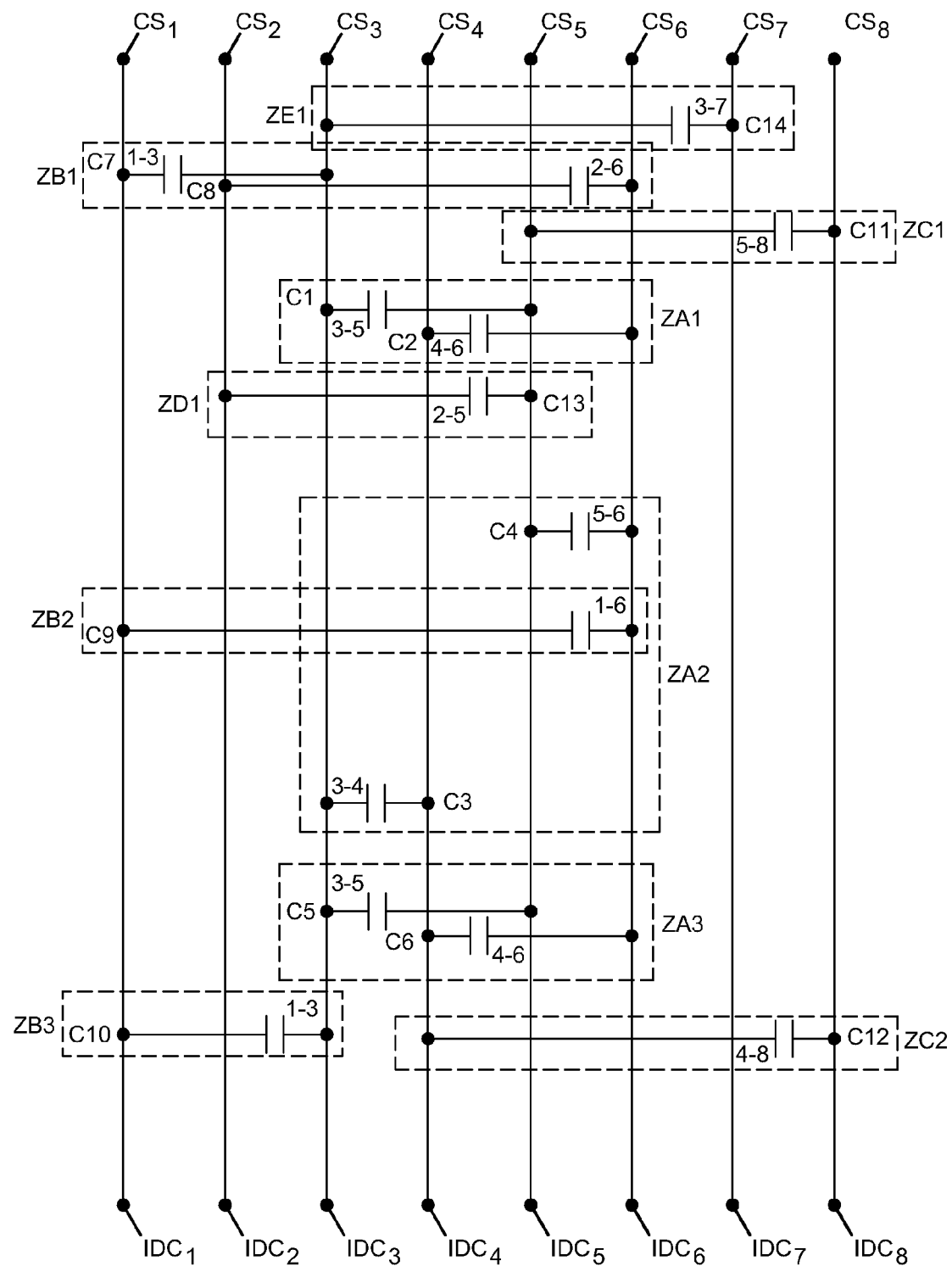
FIG. 10 is a schematic diagram showing a crosstalk compensation scheme incorporated into the telecommunications jack of FIG. 4.

The circuit board 132 includes a number of capacitive couplings having magnitudes and locations adapted to compensate for near end crosstalk and far end crosstalk. These forms of crosstalk are particularly problematic between the 4-5 and 3-6 pairs. To compensate for near end crosstalk between the 4-5 and 3-6 pairs, three interdependent zones of compensation are used between tracks $T_{4-5}$ and tracks $T_{3-6}$. As shown at FIG. 10, the three interdependent zones of compensation include a first zone of compensation $Z_{A1}$, a second zone of compensation $Z_{A2}$ and a third zone of compensation $Z_{A3}$. The first zone of compensation $Z_{A1}$ includes a capacitive coupling C1 between track $T_3$ and track $T_5$, and a capacitive coupling C2 between track $T_4$ and track $T_6$. The second zone of compensation $Z_{A2}$ includes a capacitive coupling C3 between track $T_3$ and track $T_4$, and a capacitive coupling C4 between track $T_5$ and track $T_6$. The third zone of compensation $Z_{A3}$ includes a capacitive coupling C5 between track $T_3$ and track $T_5$, and a capacitive coupling C6 between track $T_4$ and track $T_6$.

To compensate for far end crosstalk, the capacitive couplings C3 and C4 are spaced apart, such that the average distance between the zones of compensation is as described below in FIG. 11, but the distances for the C3 and C4 couplings differ. As shown, coupling C3 is placed closer to the first zone of compensation $Z_{A1}$ than coupling C4 while maintaining the average position of the zone $Z_{A2}$ such that the distance between zones is as described below in FIG. 11.

In the embodiments shown in the present disclosure, the capacitive couplings C1 and C2 are equal in magnitude and location, maintaining symmetry across the pairs. However, in certain embodiments, capacitive couplings C1 and C2 may be selected such that they differ in magnitude to compensate for alien crosstalk including the "excess" crosstalk previously mentioned, which is noted to be worst in the case of the 3-6 pair. Specifically, it was determined that changes to alien crosstalk can be made, both positively and negatively, by purposefully modifying the size of the compensating capacitors, causing them to become asymmetric in size and coupling. For example, in certain embodiments, the magnitude of capacitor C1 is greater than the magnitude of capacitor C2, which can reduce the alien crosstalk generated at the 3-6 pair. It is observed that, analogously to varying the magnitudes of C1 and C2, varying the relative magnitudes of the capacitive couplings within a zone of compensation in the compensation between the 4-5 and 3-6 pairs can improve the alien crosstalk observed. This is understood to have the effect of compensating for the overall plug and jack configuration, as opposed to typical crosstalk compensation schemes which generally only account for crosstalk generated in the jack. Additional details regarding methods and configurations for compensating for alien crosstalk are described below.

To address overall crosstalk between the 4-5 and 3-6 pairs, a relatively large amount of capacitance is used. This large amount of capacitance can cause the jack to have unacceptable levels of return loss. Methods for addressing this return loss are addressed in U.S. patent application Ser. No. 11/402,544, filed Apr. 11, 2006, now U.S. Pat. No. 7,381,098, and entitled "TELECOMMUNICATIONS JACK WITH CROSSTALK MULTI-ZONE CROSSTALK COMPENSATION AND METHOD FOR DESIGNING", which is hereby incorporated by reference in its entirety.

Figure 11:
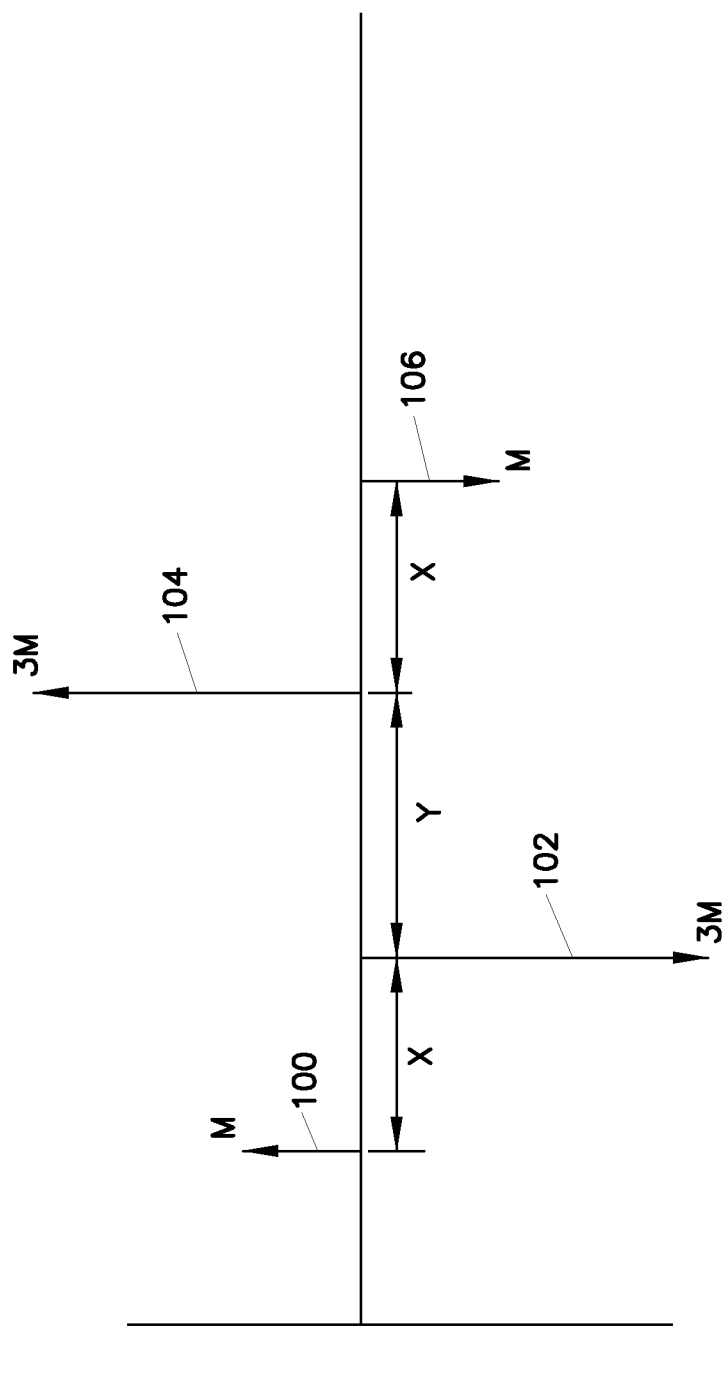
FIG. 11 is a schematic diagram showing a compensation arrangement used to provide crosstalk compensation between the 4-5 and 3-6 pairs of the telecommunications jack of FIG. 4.

FIG. 11 is a schematic diagram representative of the compensation arrangement used to provide crosstalk compensation between the 4-5 and 3-6 pairs. As shown at FIG. 11, the compensation arrangement includes a first vector 100, a second vector 102, a third vector 104, and a fourth vector 106. The first vector 100 and the third vector 104 have positive polarities, while the second vector 102 and the fourth vector 106 have negative polarities. The first vector 100 has a magnitude of M and corresponds to crosstalk introduced at the plug. The second vector 102 has a magnitude of about −3M and corresponds to the overall crosstalk introduced at the first zone of crosstalk $Z_{A1}$ generated by the board and springs. The third vector 104 has a magnitude of about 3M and corresponds to the overall crosstalk introduced at the second zone of compensation $Z_{A2}$. The fourth vector 106 has a magnitude of about −M and corresponds to the overall crosstalk introduced at the third zone of compensation $Z_{A3}$. It will be appreciated that each vector is a lump sum of the total crosstalk or crosstalk compensation provided at each respective compensation zone, with the vectors being placed at the centers or midpoints of the compensation zones.

In designing the compensation scheme of FIG. 11, a number of factors are taken into consideration when determining the placement of the compensation zones. One factor includes the need to accommodate signal travel in both directions (i.e., in forward and reverse directions) through the tracks on the circuit board. To accommodate forward and reverse transmissions through the circuit board, the compensation scheme preferably has a configuration with forward and reverse symmetry. It is also desirable for the compensation scheme to provide optimized compensation over a relatively wide range of transmission frequencies. For example, in one embodiment, performance is optimized for frequencies ranging from 1 MHz to 500 MHz. It is further desirable for the compensation arrangement to take into consideration the phase shifts that occur as a result of the time delays that take place as signals travel between the zones of compensation.

To minimize the effect of phase shift in the compensation arrangement, it is preferred for the second vector 102 to be positioned as close as possible to the first vector 100. In FIG. 11, the time delay between the first vector 100 and the second vector 102 is shown as x. In one example embodiment, x can be about 100 picoseconds for a signal having a transmission speed of $3 \times 10^8$ meters per second.

To maintain forward and reverse symmetry, it is preferred for the time delay between the third vector 104 and the fourth vector 106 to be approximately the same as the time delay between the first vector 100 and the second vector 102. As shown in FIG. 11, the time delay between the third and fourth vectors is depicted as x.

The time delay y between the second vector 102 and the third vector 104 is preferably selected to optimize the overall compensation effect of the compensation scheme over a relatively wide range of frequencies. By varying the time delay y between the second vector 102 and the third vector 104, the phase angles of the first and second compensation zones are varied thereby altering the amount of compensation provided at different frequencies. In one example embodiment, to design the time delay y, the time delay y is initially set with a value generally equal to x (i.e., the time delay between the first vector 102 and the second vector 104). The system is then tested or simulated to determine if an acceptable level of compensation is provided across the entire signal frequency range intended to be used. If the system meets the near end crosstalk requirements with the value y set equal to x, then no further adjustment of the value y is needed. If the compensation scheme fails the near end crosstalk requirements at higher frequencies, the time delay y can be shortened to improve performance at higher frequencies. If the compensation scheme fails the near end crosstalk requirements at lower frequencies, the time delay y can be increased to improve crosstalk performance for lower frequencies. It will be appreciated that the time delay y can be varied without altering forward and reverse symmetry.

It has been determined that when magnitudes of the second and third vectors 102, 104 are respectively about −3M and about 3M, the distance y is preferably greater than the distance x to provide optimized crosstalk compensation. However, if the magnitudes of the vectors 102, 104 are reduced below about −3M and about 3M (e.g., to approximately −2.7M and 2.7M), the distance y is preferably less than the distance x to provide optimized crosstalk compensation.

Crosstalk can also be an issue between the 1-2 and 3-6 pairs. Particularly, substantial crosstalk can be generated between track $T_2$ and track $T_3$. As shown at FIG. 10, a three-zone compensation arrangement is used to compensate for this crosstalk. The three-zone compensation arrangement includes a first zone of compensation $Z_{B1}$, a second zone of compensation $Z_{B2}$ and a third zone of compensation $Z_{B3}$. The first zone of compensation $Z_{B1}$ includes a capacitive coupling C7 between track $T_1$ and track $T_3$, and a capacitive coupling C8 between track $T_2$ and track $T_6$. The second zone of compensation $Z_{B2}$ includes a capacitive coupling C9 between track $T_1$ and track $T_6$. The third zone of compensation $Z_{B3}$ includes a capacitive coupling C10 between track $T_1$ and track $T_3$. The three zones of compensation between the 1-2 and 3-6 pairs can be placed at locations consistent with the vector diagram shown in FIG. 11, described above.

In general, it has been determined that varying the relative compensation among the pairs at the primary zones of compensation for each pair can affect alien crosstalk. Regarding the zone of compensation $Z_{B1}$, it has been determined that varying the relative magnitudes of the capacitive couplings C7 and C8, such that the capacitive couplings are non-equal, can improve overall alien crosstalk of the plug and jack system. In the embodiment shown, a larger capacitance is used for capacitance C7 than C8, with the overall capacitance relating to the capacitive coupling introduced at the plug, as described above in conjunction with FIG. 11.

In general, it has been determined that in zone of compensation $Z_{B2}$ performance is optimized without use of a capacitive coupling between track $T_2$ and track $T_3$. However, in certain embodiments, such a capacitive coupling can be included to preserve symmetry between the pairs. Likewise, in zone $Z_{B3}$, no capacitive coupling is included between track $T_2$ and track $T_6$, although in symmetric systems such a coupling could be included. Furthermore, it will be appreciated that the magnitudes of the compensation between the 3-6 and 4-5 pairs are substantially greater in magnitude than those between the 1-2 and 3-6 pairs.

Additional crosstalk exists between the 4-5 and 7-8 pairs. In the embodiment of the crosstalk compensation arrangement shown in FIG. 10, a two zone arrangement is used to compensate for crosstalk between those pairs. As shown, the compensation arrangement between the 4-5 and 7-8 pairs is a two zone compensation including a capacitive coupling C11 in a first zone $Z_{C1}$ provided between track $T_5$ and track $T_8$, and capacitive coupling C12 in a second zone $Z_{C2}$ provided between track $T_4$ and track $T_8$.

Figure 12:
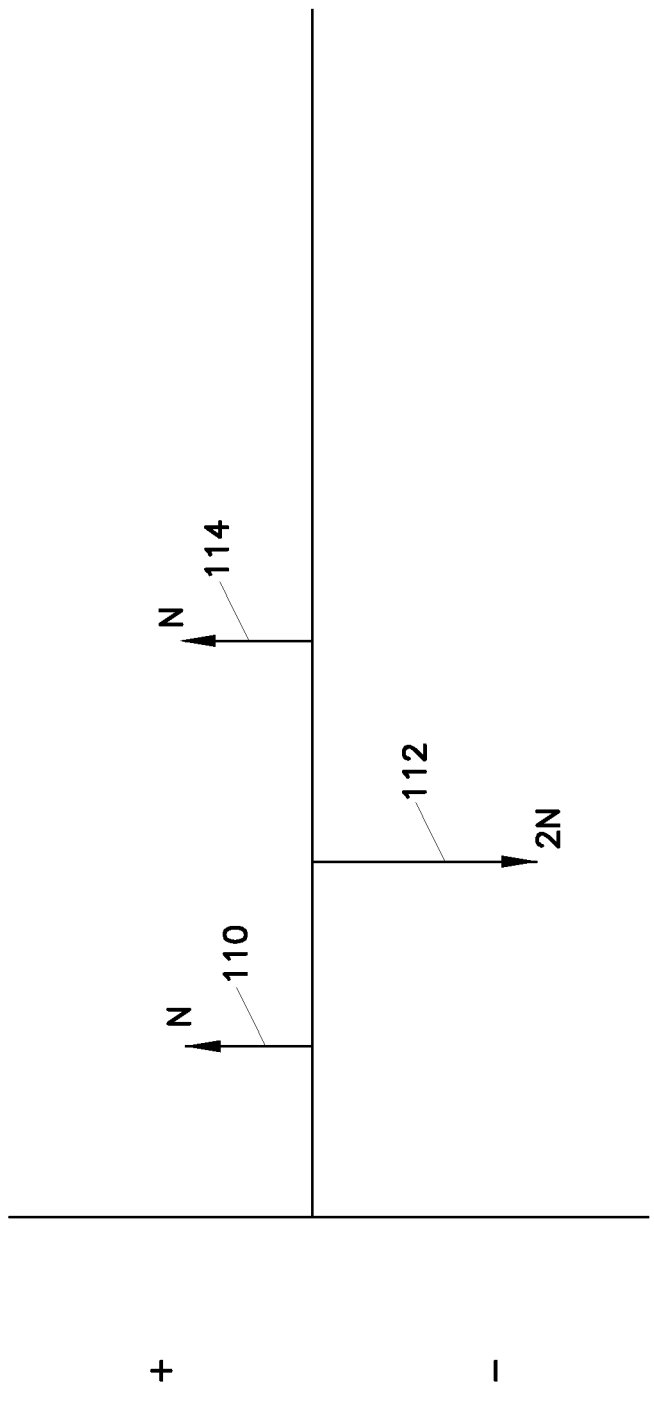
FIG. 12 is a schematic vector diagram showing a compensation arrangement used to provide crosstalk compensation between the 4-5 and 7-8 pairs of the telecommunications jack of FIG. 4.

FIG. 12 is a schematic vector diagram showing the compensation arrangement used between the 4-5 and 7-8 pairs. As shown at FIG. 12, three crosstalk vectors are taken into consideration. The first crosstalk vector 110 is representative of crosstalk generated at the plug. A second vector 112 is representative of crosstalk provided at the first compensation zone $Z_{C1}$. The third vector 114 is representative of crosstalk generated at the second compensation zone $Z_{C2}$. The first and third vectors 110, 114 have positive polarities and magnitudes of about N. The second vector 112 has a negative polarity and a magnitude about 2N. Although the disclosed compensation arrangement is asymmetric among the pairs, a symmetric arrangement could be provided as well. Furthermore, it will be appreciated that M (shown at FIG. 11) is typically substantially greater in magnitude than N (shown at FIG. 12).

As described above, varying the capacitive values across the 4-5 and 7-8 wire pairs used in the first zone of compensation $Z_{C1}$ can improve alien crosstalk values generated from the plug-jack system. In the embodiment shown, a completely unbalanced configuration is selected, such that $Z_{C1}$ includes only compensation between track $T_5$ and track $T_8$, with no corresponding balanced compensation between tracks $T_4$ and $T_7$. In further embodiments, a different, unbalanced arrangement may be selected.

In addition to the multiple zone compensation arrangements described above, a number of single zone compensations can also be used. For example, zone $Z_{D1}$ is a single zone compensation used to compensate for crosstalk generated between the 1-2 and 4-5 pairs, and includes a capacitive coupling C13 provided between track $T_2$ and track $T_5$. Another single zone compensation $Z_{E1}$ compensates for crosstalk generated between the 3-6 and 7-8 pairs, and is provided by a capacitive coupling C14 formed between track $T_3$ and track $T_7$. Other capacitive couplings may be included which compensate for unintended crosstalk generated within the board itself.

Again, each of the single zone compensations is illustrated as using an unbalanced arrangement to account for alien crosstalk generated by the plug and jack. It is observed that the "excess" alien crosstalk may be caused, at least in part, by an imbalance in connecting hardware contributing to excess crosstalk between the cables, particularly in short sections of cable between connectors. Therefore, imbalanced compensation across wire pairs can compensate for this excess crosstalk. In the embodiment shown, zone $Z_{D1}$ includes only compensation C13 between track $T_2$ and track $T_5$, but no compensation between tracks track $T_1$ and track $T_4$. Similarly, zone $Z_{E1}$ includes only compensation C14 between track $T_3$ and track $T_7$, but no compensation between tracks track $T_6$ and track $T_8$.

The crosstalk compensation schemes illustrated herein generally are accomplished by first positioning a crosstalk compensation arrangement relating to crosstalk within the plug and jack, across a variety of wire pairs. In designing the multi-zone crosstalk compensation schemes in accordance with this disclosure, a designer will generally first locate a first zone of capacitive coupling a first time delay away from the capacitive coupling at the plug. The designer can then position a second capacitive coupling, i.e. a second zone of compensation, at a second time delay away from the first time delay. That second zone of compensation can be made up of more than one capacitive coupling, and can have capacitive couplings of differing magnitude. For example, two capacitors can make up a zone of compensation, and can be placed at differing distances from a first zone. An example of such a configuration is illustrated by zone $Z_{A2}$ as described above.

Once crosstalk for the plug and jack have been brought to an acceptable level using the techniques described above, the compensation arrangement can be altered to improve alien crosstalk. Altering the compensation arrangement is performed to accommodate one or more zones of crosstalk compensation having an asymmetric capacitive coupling between a wire pairs, such that alien crosstalk is reduced. This can be performed by changing the relative magnitudes of the capacitive couplings between wire pairs in one or more of the zones of compensation. In certain embodiments, a designer can start with a compensation arrangement having symmetric capacitive couplings across complementary wire pairs (e.g. from the 3-6 pair to the 4-5 pair, having equal couplings between $T_3$ and $T_5$ and between $T_4$ and $T_6$).

The various capacitive couplings illustrated in the present disclosure provide an example design for which far end and alien crosstalk are addressed. Additional embodiments exist in which these types of crosstalk are compensated for. In the various embodiments, any amount of asymmetry in any zone of compensation can be introduced to compensate for alien crosstalk, from complete symmetry to complete asymmetry.

In general, the various asymmetric capacitive coupling selections made to account for alien crosstalk are believed to, as a whole, compensate for crosstalk generated in an overall system including both a plug and a contact set of a modular jack, as described above in FIGS. 4-7. It is particularly notable that the crosstalk compensations selected in the present disclosure may not be symmetric in the sense that equal capacitive couplings are not applied across complementary tracks of a wire pair. Although this may have the effect of slightly worse performance with respect to connector balance and crosstalk within the pair, the net effect of a number of plug and jack systems in close proximity is an improved overall crosstalk compensation.

Figure 13:
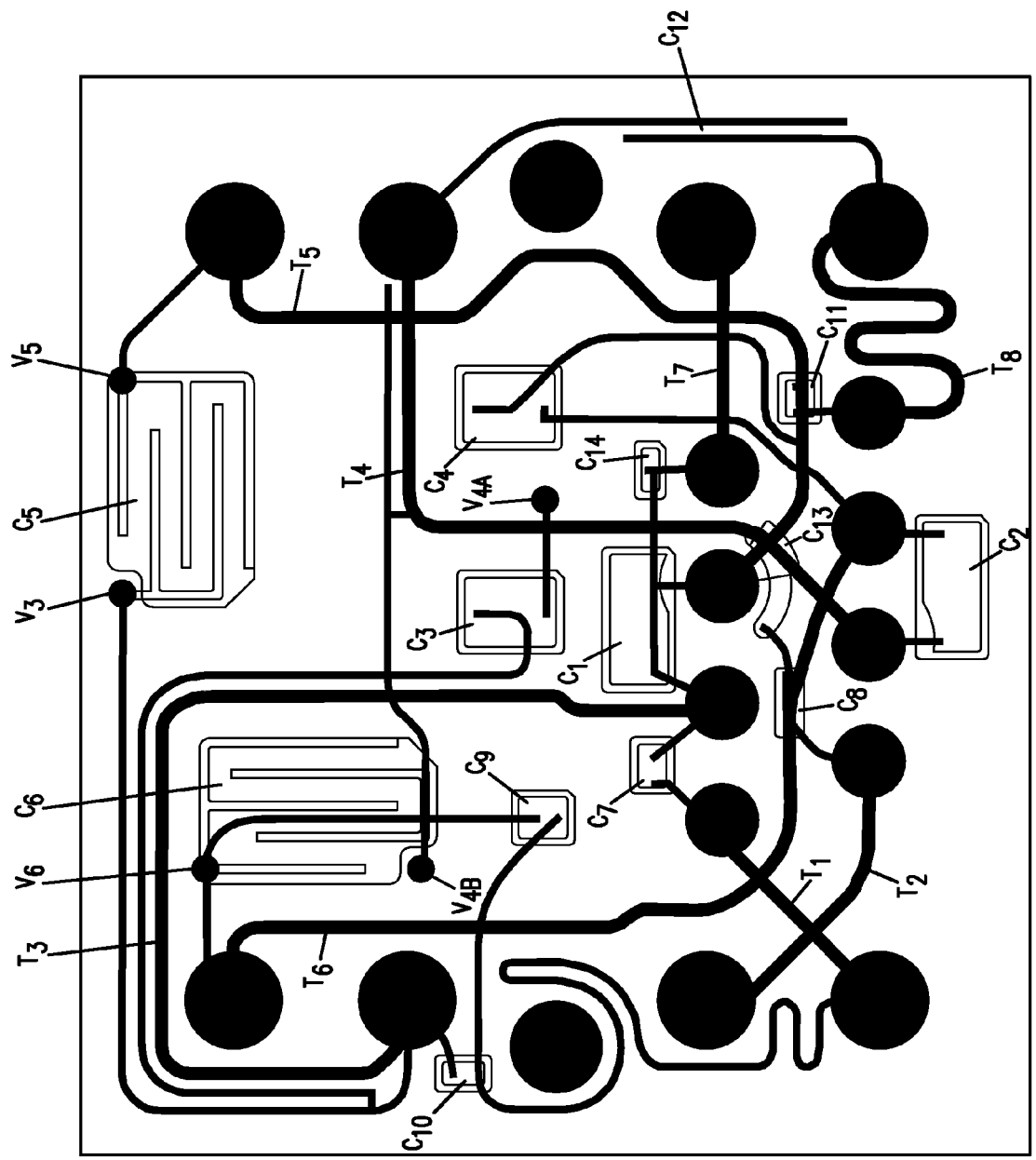
FIG. 13 is a tracing overlay view of the circuit board used in the telecommunications jack of FIG. 4.
Figure 14:
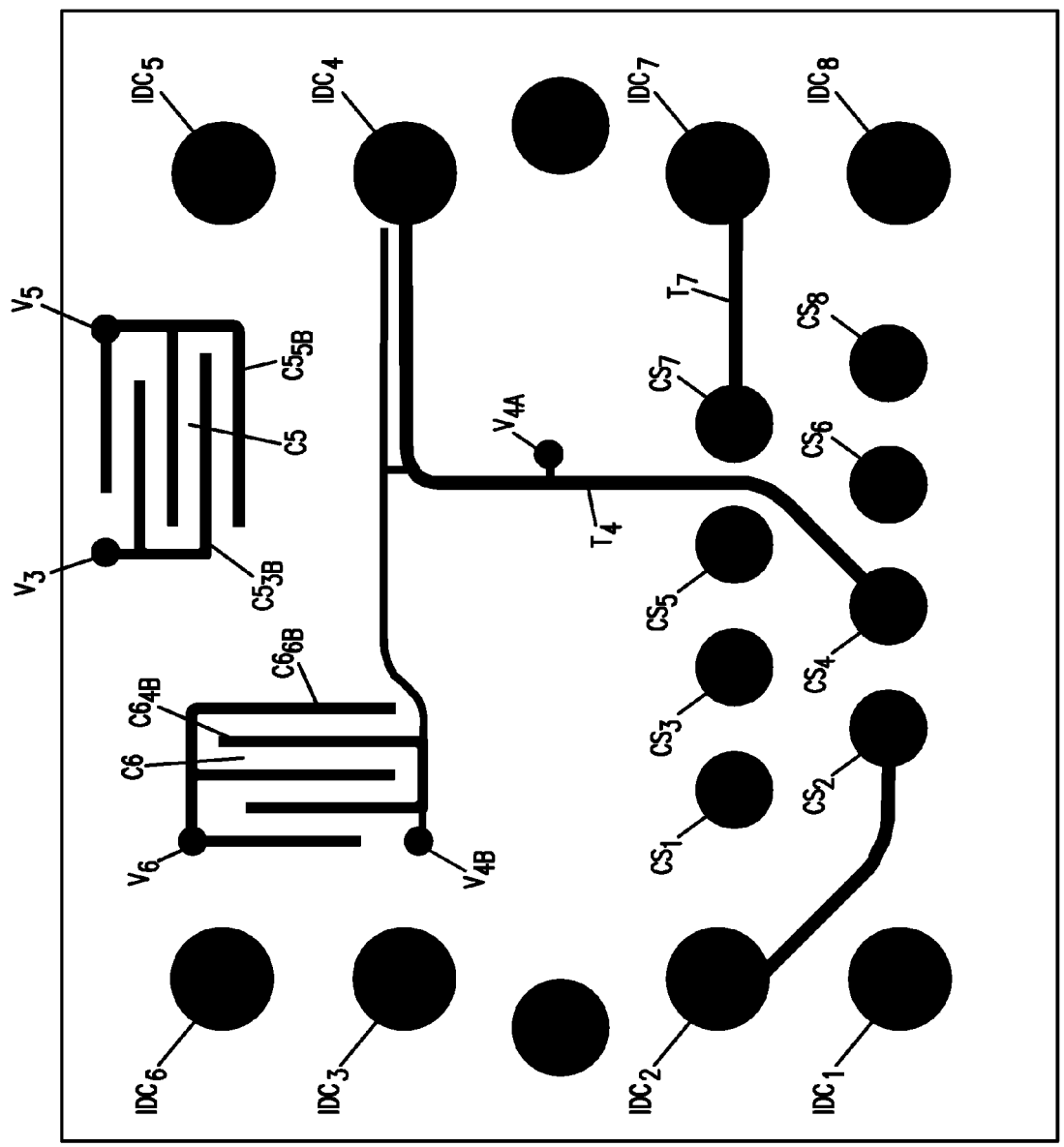
FIG. 14 shows a front conductive layer of the circuit board used in the telecommunications jack of FIG. 4.
Figure 15:
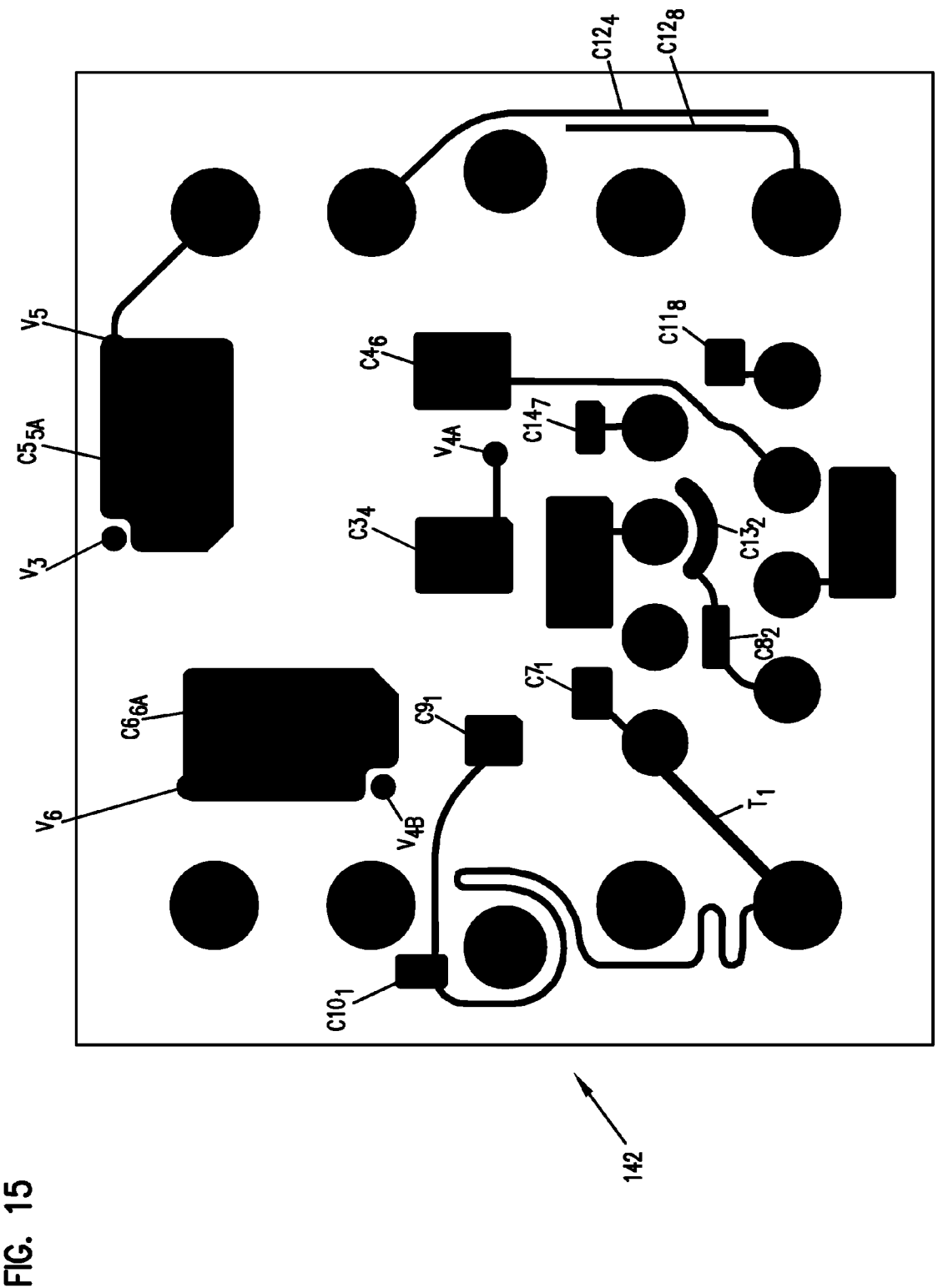
FIG. 15 shows a middle conductive layer of the circuit board used in the telecommunications jack of FIG. 4.
Figure 16:
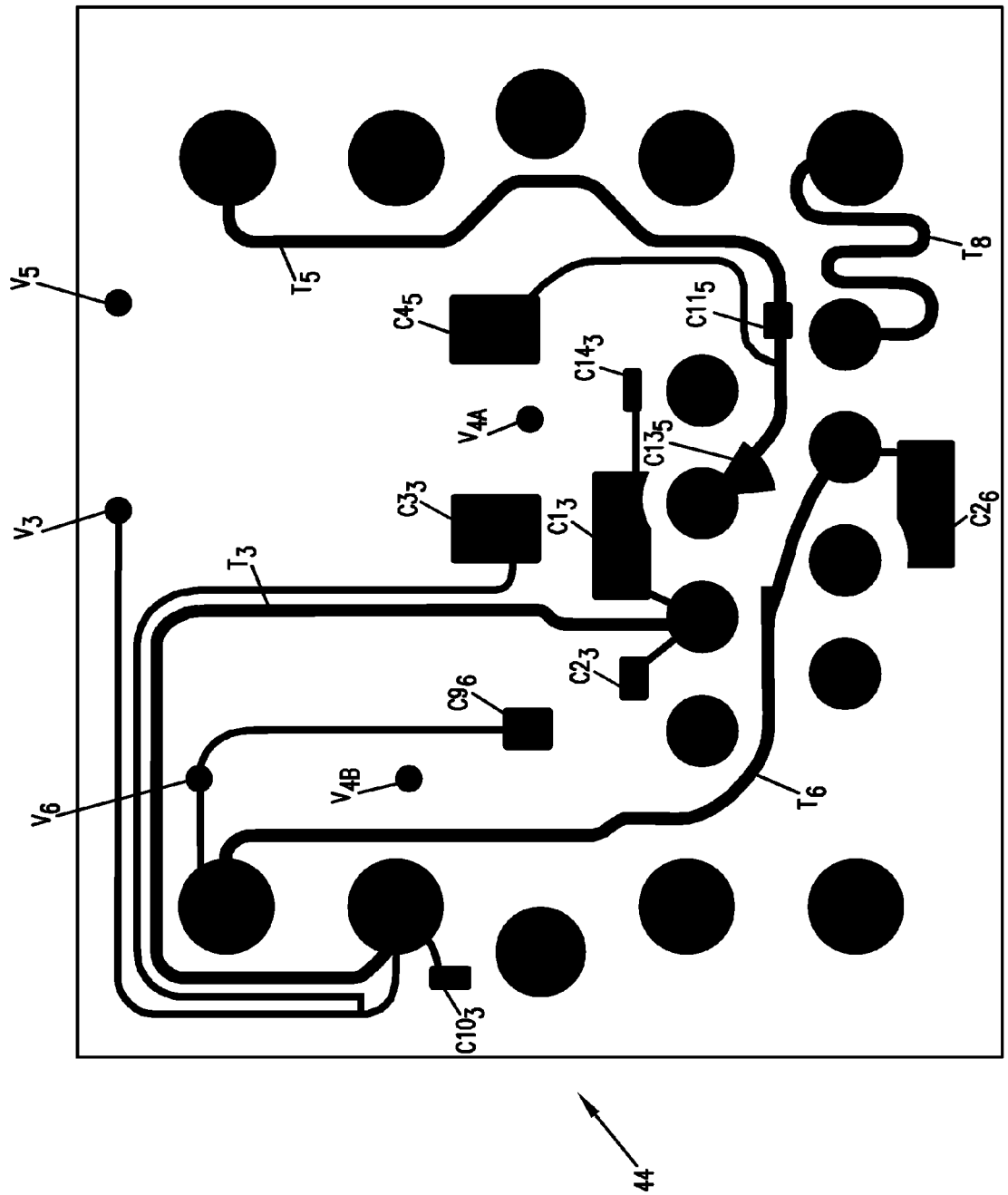
FIG. 16 is shows a back conductive layer of the circuit board used in the telecommunications jack of FIG. 4.

FIGS. 13-16 show an example circuit board layout for implementing the compensation arrangement of FIG. 10. FIGS. 14-16 respectively show the front, middle and back conductive layers 140, 142 and 144 of the circuit board 132. FIG. 13 is an overlay of the three conductive layers 140, 142 and 144. The circuit board 132 defines openings 301-308 that respectively receive posts of the contact springs $CS_1$-$CS_8$ so that the contact springs $CS_1$-$CS_8$ are terminated to the board 132. The circuit board also defines openings 401-408 for respectively receiving posts of the insulation displacement connector blades $IDC_1$-$IDC_8$ such that the insulation displacement connector blades $IDC_1$-$IDC_8$ are terminated to the circuit board. Vias extend through the circuit board for electrically interconnecting the tracks between the layers 140, 142 and 144, and to the various capacitive couplings C1-C13. For example, vias $V_{4A}$ and $V_{4B}$ interconnect the portions of the track $T_4$ located at the different layers 140, 142 and 144 to the capacitive couplings C3 and C6. Also, via $V_5$, interconnects the portions of the track $T_5$ located at the different layers 140, 142 and 144 to capacitive coupling C5. Moreover, via $V_6$ interconnects the portions of the track $T_6$ located at the different layers 140, 142 and 144 with capacitive coupling C6. Likewise, via $V_3$ interconnects the portions of the track $T_3$ located at the different layers 140, 142 and 144 to capacitive coupling C5.

Referring to FIGS. 14-16, the capacitive coupling C1 of the first zone of compensation $Z_{A1}$ is provided by opposing capacitor plates $C1_5$ and $C1_3$ respectively provided at layers 142 and 144. The capacitive coupling C2 of the first zone of compensation $Z_{A1}$ is provided by opposing capacitor plates $C2_4$ and $C2_6$ that are respectively provided at the layers 142 and 144. The capacitive coupling C3 of the second compensation zone $Z_{A2}$ is provided by opposing capacitor plates $C3_4$ and $C3_3$ that are respectively provided at layers 142 and 144. The capacitive coupling C4 of the second compensation zone $Z_{A2}$ is provided by opposing capacitor plates $C4_6$ and $C4_5$ that are respectively provided at layers 142 and 144. The capacitive coupling C5 of the third compensation zone $Z_{A3}$ is provided by a capacitor plate $C5_{5A}$ that is provided at layer 142. The capacitive coupling C5 is also provided by inter-digitated capacitor fingers $C5_{5B}$ and $C5_{3B}$ that are provided at layer 140. The capacitive coupling C6 of the second compensation zone $Z_{A3}$ is provided by capacitor plate $C6_{6A}$ provided at layer 142. The capacitive coupling C6 is also provided by inter-digitated capacitor fingers $C6_{6B}$ and $C6_{4B}$ provided at layer 140.

The capacitive coupling C7 of the first compensation zone $Z_{B1}$ is provided by opposing capacitor plates $C7_1$ and $C7_3$ that are respectively provided at layers 142 and 144 of the circuit board. The capacitive coupling C8 of the first compensation zone $Z_{B1}$ is provided by opposing capacitor plates $C8_2$ and $C8_6$ that are respectively provided at the layers 142 and 144 of the circuit board. The capacitive coupling C9 of the second zone of compensation $Z_{B2}$ is provided by opposing capacitor plates $C9_1$ and $C9_6$ that are respectively provided at layer 142 and 144 of the circuit board. The capacitive coupling C10 of the third zone of compensation $Z_{B3}$ is provided by opposing capacitor plates $C10_1$ and $C10_3$ that are respectively provided at layers 142 and 144 of the circuit board.

The capacitive coupling C11 of the first compensation zone $Z_{C1}$ is provided by opposing capacitor plates $C11_5$ and $C11_8$ that are respectively provided at layers 142 and 144 of the circuit board. The capacitive coupling C12 of the second compensation zone ZC2 is provided by adjacent leads C124 and C128, respectively, located at layer 142. The capacitive coupling C13 of the zone of compensation $Z_{D1}$ is provided by opposing capacitor plates $C13_2$ and $C13_5$ provided at layers 142 and 144 of the circuit board. The capacitive coupling C14 of the zone of compensation $Z_{E1}$ is provided by opposing capacitor plates $C14_7$ and $C14_3$ respectively provided at layers 142 and 144 of the circuit board.

Various manufacturing and routing techniques may be implemented in the placement of the tracks, vias, and capacitors described herein. Additional details regarding the routing and placement of circuit components are described in U.S. patent application Ser. No. 11/402,544, filed Apr. 11, 2006, now U.S. Pat. No. 7,381,098, which was previously incorporated by reference in its entirety.

The above specification, examples and data provide a complete description of the manufacture and use of the composition of the invention. Since many embodiments of the invention can be made without departing from the spirit and scope of the invention, the invention resides in the claims hereinafter appended.

The invention claimed is:

1. A telecommunications jack for use in a twisted pair system, the jack comprising:
   a housing defining a port for receiving a plug;
   a plurality of contact springs adapted to make electrical contact with the plug when the plug is inserted into the port of the housing;
   a plurality of wire termination contacts for terminating wires to the jack;
   a circuit board including conductive tracks that electrically connect the contact springs to the wire termination contacts, the circuit board having a first side and an opposite second side, wherein the plurality of contact springs extend from the first side of the circuit board and the plurality of wire termination contacts extend from the second side of the circuit board; and
   a crosstalk compensation arrangement that provides crosstalk compensation between selected tracks of the circuit board, the crosstalk compensation arrangement including a first zone of compensation a first time delay away from the capacitive coupling of the plug and a second zone of compensation at a second time delay from the first zone of compensation, the second zone of compensation including two capacitive elements spaced at different, time delays from the first zone of compensation to optimize far end crosstalk and having an average time delay that optimizes near end crosstalk, wherein the capacitive coupling in the first zone has an opposite polarity than the capacitive coupling in the plug, and wherein the capacitive coupling in the second zone has the same polarity as the capacitive coupling in the plug.

2. The telecommunications jack of claim 1, Wherein the first zone includes two capacitive elements that differ in magnitude, thereby reducing alien crosstalk generated by the plug and jack.

3. The telecommunications jack of claim 1, wherein the first and second zones of compensation are placed across the 3-6 and 4-5 wire pairs within the jack.

4. A telecommunications jack for use in a twisted pair system, the jack comprising:
   a plurality of contact springs adapted to make electrical contact with a plug when the plug is inserted into the jack;
   a plurality of wire termination contacts for terminating wires to the jack;
   a crosstalk compensation arrangement that provides crosstalk compensation between elected tracks extending between the contact springs and the wire termination contacts, the crosstalk compensation arrangement including:
   a first coupling including first and second capacitive elements between first and second wire pairs of a jack, the first and second capacitive elements each having a differing magnitude of capacitive coupling to the first and second wire pairs to compensate for alien crosstalk; and
   a second coupling including third and fourth capacitive elements between the first and second wire pairs of a jack at a time delay from the first coupling, wherein the second time delay corresponds to an average time delay, and wherein different time delays of the third and fourth capacitive elements in the coupling are centered about the average time delay to optimize near end crosstalk and are spaced apart to reduce far end crosstalk.

5. The telecommunications jack of claim 4, further including a circuit board having a first side and a second side, wherein there plurality of contact springs are coupled to the first side and the plurality of wire termination contacts are coupled to the second side, and wherein the first and second coupling are on the circuit board.

6. A telecommunications jack with a plurality of wire pairs for use in a twisted pair system, the jack comprising:
   a housing defining a port for receiving a plug;
   a plurality of contact springs adapted to make electrical contact with the plug when the plug is inserted into the port of the housing;
   a plurality of wire termination contacts for terminating wires to the jack;
   a circuit board including conductive tracks that electrically connect the con tact springs to the wire termination contacts; and
   a crosstalk compensation arrangement that provides crosstalk compensation between selected tracks of the circuit board, the crosstalk compensation arrangement including a first zone having an asymmetric capacitive coupling between a first wire pair and a second wire pair, and a second zone with a polarity opposite the polarity of the first zone and having an asymmetric capacitive coupling between the first wire pair and the second wire pair, the first zone positioned nearer to the contact springs than the second zone, and wherein the first zone includes two capacitive elements that connect between different wires of the first wire pair and the second wire pair, and wherein the two capacitive elements have different magnitudes.

7. The telecommunications jack of claim 6, wherein the crosstalk compensation arrangement includes two zones of crosstalk compensation between a third wire pair, and one of the first or second wire pairs, and wherein at least one of the two zones has asymmetric capacitive coupling.

8. The telecommunications jack of claim 6, wherein the second zone includes two capacitive elements that connect between different wires of the first wire pair and the second wire pair.

9. The telecommunications jack of claim 8, wherein the first wire pair is a 3-6 wire pair and the second wire pair is the 4-5 wire pair.

10. A telecommunication jack with a plurality of wire pairs for use in a twisted pair system, the jack comprising:
    a housing defining a port for receiving a plug;

a plurality of contact springs adapted to make electrical contact with the plug when the plug is inserted into the port of the housing;

a plurality of wire termination contacts for terminating wires to the jack;

a circuit board including conductive tracks that electrically connect the contact springs to the wire termination contacts; and a crosstalk compensation arrangement that provides crosstalk compensation between a first wire pair and a second wire pair, the crosstalk compensation arrangement including a first zone having an asymmetric capacitive coupling between a first wire pair and a second wire pair, and a second zone with capacitive coupling between the first pair and the second pair and having a polarity opposite the polarity of the first zone, the first zone positioned nearer to the contact springs than the second zone, and wherein the first zone includes two capacitive elements that connect between different wires of the first wire pair and the second wire pair, and wherein the two capacitive elements have different magnitudes, and wherein the second zone includes two capacitive elements that connect between different wires of the first wire pair and the second wire pair.

11. The telecommunications jack of claim 10, wherein the second zone has asymmetric capacitive coupling, and wherein the two capacitive elements in the second zone have different magnitudes.

12. The telecommunications jack of claim 10, wherein the crosstalk compensation arrangement is entirety on the circuit board.

13. A telecommunications jack with a plurality of wire pairs for use in a twisted pair system, the jack comprising:

a housing defining a port for receiving a plug;

a plurality of contact springs adapted to make electrical contact with the plug when the plug is inserted into the port of the housing;

a plurality of wire termination contacts for terminating wires to the jack;

a circuit board including conductive tracks that electrically connect the contact springs to the wire termination contacts; and a crosstalk compensation arrangement that provides crosstalk compensation between selected wire pairs of the jack, the crosstalk compensation arrangement including a plurality of zones of crosstalk compensation including a first primary zone having an asymmetric capacitive coupling between a first wire pair and a second wire pair and a second primary zone having an asymmetric capacitive coupling between a third wire pair and the first wire pair, the first and second primary zones of crosstalk compensation positioned nearest to the contact springs associated with the first wire pair and the second wire pair;

Wherein the first primary zone includes a first capacitive coupling between a first wire of the first wire pair and a first wire of the second wire pair, and a second capacitive coupling between a second wire of the first wire pair and a second wire of the second wire pair, the first capacitive coupling having a magnitude greater than the second capacitive coupling.

14. The telecommunications jack of claim 13, wherein the second primary zone includes a first capacitive coupling and a second capacitive coupling between the third wire pair and the first wire pair, the first capacitive coupling of the second primary zone having a magnitude greater than the second capacitive coupling.

15. The telecommunications jack of claim 13, wherein the first capacitive coupling in the first primary zone is provided by a first capacitive element and a second capacitive coupling in the first primary zone is provided by a second capacitive element.

16. The telecommunications jack of claim 15, wherein the first and second capacitive elements are plate capacitors.

17. The telecommunications jack of claim 13, wherein the first wire pair is the 3-6 wire pair, and the second wire pair is the 4-5 wire pair.

18. The telecommunications jack of claim 17, wherein the third wire pair is the 1-2 wire pair.

19. The telecommunications jack of claim 13, wherein the plurality of zones of crosstalk compensation further includes a first secondary zone of crosstalk compensation between the first and second wire pairs, and a second secondary zone of crosstalk compensation between the third wire pair and the first wire pair.

20. The telecommunications jack of claim 19, wherein at least one of the first or second secondary zones includes asymmetric capacitive coupling between the wire pairs.

21. The telecommunications jack of claim 13, wherein the plurality of zones of crosstalk compensation are entirely on the printed circuit board.

* * * * *